United States Patent
Sankar et al.

(10) Patent No.: US 12,089,364 B2
(45) Date of Patent: *Sep. 10, 2024

(54) SYSTEM LEVEL CONTROL OF MEMS-BASED COOLING SYSTEMS

(71) Applicant: Frore Systems Inc., San Jose, CA (US)

(72) Inventors: Ganapathy Sankar, Cupertino, CA (US); Marc Mignard, Los Gatos, CA (US); Shekhar Halakatti, Campbell, CA (US); Suchitra Ramesh, San Jose, CA (US); Suryaprakash Ganti, Los Altos, CA (US); Seshagiri Rao Madhavapeddy, La Jolla, CA (US); Prabhu Sathyamurthy, San Jose, CA (US)

(73) Assignee: Frore Systems Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/242,377

(22) Filed: Sep. 5, 2023

(65) Prior Publication Data

US 2023/0422430 A1 Dec. 28, 2023

Related U.S. Application Data

(63) Continuation of application No. 17/473,774, filed on Sep. 13, 2021, now Pat. No. 11,785,739.

(60) Provisional application No. 63/079,923, filed on Sep. 17, 2020.

(51) Int. Cl.
*H05K 7/20* (2006.01)

(52) U.S. Cl.
CPC .................. *H05K 7/20172* (2013.01)

(58) Field of Classification Search
CPC .......... H05K 7/20172; H05K 7/20327; H05K 7/20309; G06F 1/203; G06F 2/20; G06F 2/201
See application file for complete search history.

(56) References Cited

U.S. PATENT DOCUMENTS

| | | | |
|---|---|---|---|
| 2012/0063091 A1 | 3/2012 | Dede | |
| 2017/0292537 A1* | 10/2017 | Barak | ..... F04D 25/06 |
| 2020/0053905 A1* | 2/2020 | Ganti | ..... H05K 7/20281 |
| 2021/0183739 A1 | 6/2021 | Sathyamurthy | |

FOREIGN PATENT DOCUMENTS

CN 110914610 3/2020

* cited by examiner

*Primary Examiner* — Emmanuel E Duke
(74) *Attorney, Agent, or Firm* — Van Pelt, Yi & James LLP

(57) ABSTRACT

A system including a plurality of cooling cells and a switching and control module is described. The cooling cells including cooling elements configured to be actuated to induce vibrational motion to drive a fluid toward a heat-generating structure. The switching and control module is coupled to the cooling elements and provides drive signals to the cooling elements based on at least one drive signal input. Each of the drive signals has a frequency corresponding to a cooling element. The frequency of the drive signal corresponds to a resonant state of the cooling element.

19 Claims, 10 Drawing Sheets

SYSTEM LEVEL CONTROL OF MEMS-BASED COOLING SYSTEMS

CROSS REFERENCE TO OTHER APPLICATIONS

This application is a continuation of U.S. patent application Ser. No. 17/473,774 entitled SYSTEM LEVEL CONTROL OF MEMS-BASED COOLING SYSTEMS filed Sep. 13, 2021, which claims priority to U.S. Provisional Patent Application No. 63/079,923 entitled SYSTEM LEVEL CONTROL OF MEMS-BASED COOLING SYSTEMS filed Sep. 17, 2020, both of which are incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
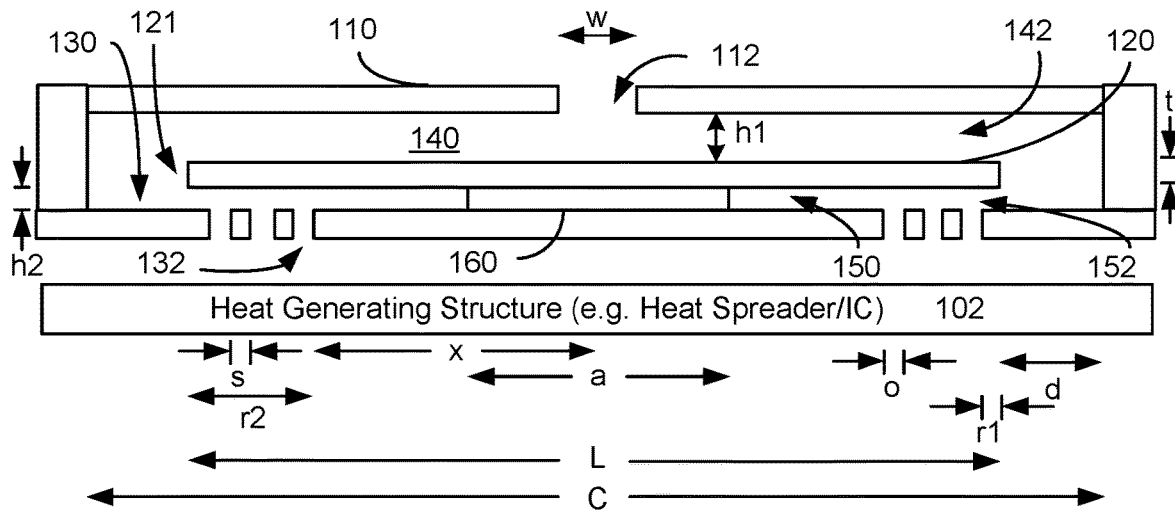
FIGS. 1A-1F depict an embodiment of an active cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated.

Varying configurations of computing devices further complicate heat management. For example, computing devices such as laptops are frequently open to the external environment while other computing devices, such as smartphones, are generally closed to the external environment. Thus, active heat management solutions for open devices, such as fans, may be inappropriate for closed devices. A fan driving heated fluid from the inside of the computing device to the outside environment may be too large for closed computing devices such as smartphones and may provide limited fluid flow. In addition, the closed computing device has no outlet for the heated fluid even if the fan can be incorporated into the closed computing device. Thus, the thermal management provided by such an open-device mechanism may have limited efficacy. Even for open computing devices, the location of the inlet and/or outlet may be configured differently for different devices. For example, an outlet for fan-driven fluid flow in a laptop may be desired to be located away from the user's hands or other structures that may lie within the outflow of heated fluid. Such a configuration not only prevents the user's discomfort but also allows the fan to provide the desired cooling. Another mobile device having a different configuration may require the inlets and/or outlets to be configured differently, may reduce the efficacy of such heat management systems and may prevent the use of such heat management systems. Thus, mechanisms for improving cooling in computing devices are desired.

Space and other limitations in computing devices further limit the use of active cooling systems. Active cooling systems are those in which an electrical signal is used to drive cooling. A conventional fan is an example of an active cooling system, while a heat sink is an example of a passive cooling system. Space and power limitations restrict the ability to provide electrical connection to active cooling systems. For example, if multiple active cooling systems are used, the connections to the active cooling systems may be required to fit within a small area. In addition, the power consumed by such a cooling system may be desired to be small, particularly for mobile devices. Consequently, active cooling systems face particular challenges when used in computing devices such as active computing devices.

A system including a plurality of cooling cells and a switching and control module is described. The cooling cells include cooling elements configured to be actuated to induce vibrational motion to drive a fluid toward a heat-generating structure. The switching and control module is coupled to the cooling elements and provides drive signals to the cooling elements based on at least one drive signal input. Each of the drive signals has a frequency corresponding to a cooling element. The frequency of the drive signal corresponds to a resonant state of the cooling element. The frequency may thus correspond to a structural resonant frequency for the cooling element and/or an acoustic resonant frequency for the cooling element.

In some embodiments, a drive signal is provided to at least two cooling elements. Thus, multiple cooling elements may be driven using the same drive signal. For example, in some embodiments, the switching and control module organizes the cooling elements into bins based on a resonant frequency of the resonant state for each cooling element. The drive signal corresponding to a bin is provided to each cooling element in the bin. In some embodiments, the frequency of the drive signal for the bin is within ten percent of the resonant frequency for each of a portion of the plurality of cooling elements in the bin. In some embodiments, the switching and control module provides at least two drive signals based on a single drive signal input drive signal input.

The switching and control module may further include current monitors for the cooling elements. An output of each current monitor indicates a deviation of the frequency of the driving signal from a resonant frequency of the cooling element. The drive signals are adjusted based on the deviations. Thus, feedback from the current monitors may be used to control the drive signals. In some embodiments, processor(s) are used to determine the resonant frequency based on the output of each of the plurality of current monitors.

The vibrational motion of the cooling element includes a driving phase and a relaxation phase. In some embodiments, therefore, system further includes at least one energy regenerator coupled with the cooling elements and with the switching and control module, the at least one energy regenerator configured to receive power from the plurality of cooling elements due to the relaxation phase of the vibrational motion.

A system including a plurality of cooling cells and a switching and control module is described. The cooling cells include cooling elements configured to be actuated to induce vibrational motion to drive a fluid toward a heat-generating structure. The switching and control module includes at least one signal input for receiving at least one drive signal input, at least one control input, and outputs coupled to the plurality of cooling elements. The outputs provide drive signals to the cooling elements based on the at least one drive signal input and based on a control signal provided to the control signal input(s). Each of the plurality of drive signals having a frequency corresponding to a resonant state of a cooling element.

A method is described. The method includes receiving at least one drive signal input. Drive signals are provided to cooling elements based on drive signal input(s). Each of the drive signals has a frequency corresponding to a cooling element. Cooling cells include the cooling elements. The cooling elements are configured to be actuated to induce vibrational motion to drive a fluid toward a heat-generating structure. The frequency corresponds to a resonant state of the cooling element.

A drive signal may be provided to at least two cooling elements. For example, in some embodiments, the cooling elements are organized into bins based on a resonant frequency of the resonant state for each cooling element. The drive signal corresponding to a bin is provided to each cooling element in the bin. In some embodiments, the frequency of the drive signal for the bin is within ten percent of the resonant frequency for each of a portion of the plurality of cooling elements in the bin. In some embodiments, at least two drive signals are provided based on a single drive signal input drive signal input.

The drive signal for each cooling element may be measured. The measured drive signal indicates a deviation of the frequency from a resonant frequency of the cooling element. Thus, the drive signals may be adjusted based on the deviation.

The vibrational motion of the cooling element includes a driving phase and a relaxation phase. In some embodiments, therefore, the method further includes receiving power from the cooling elements due to the relaxation phase of the vibrational motion and storing the power.

Figure 1B:
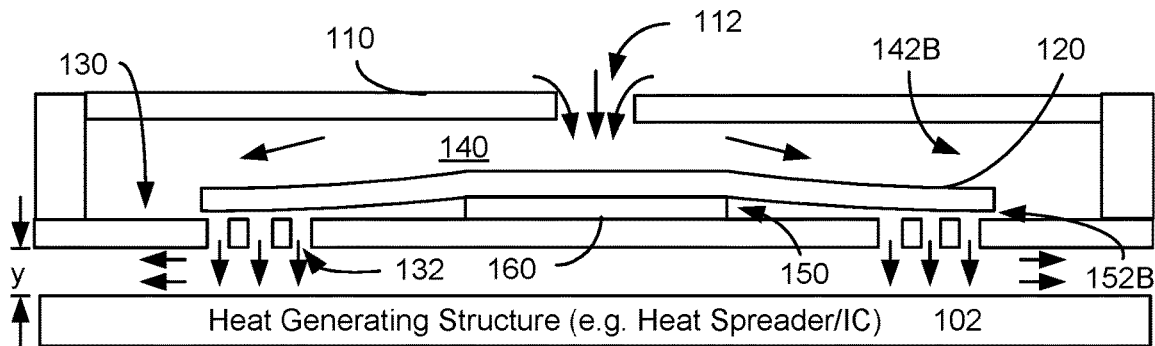
Figure 1C:
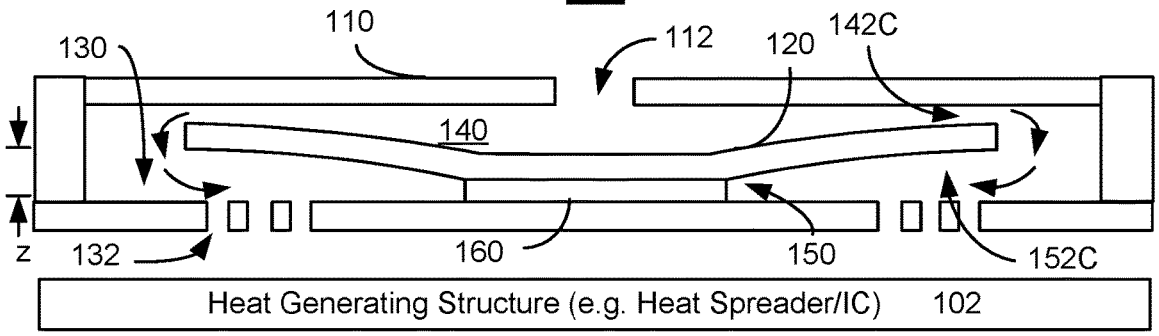
Figure 1D:
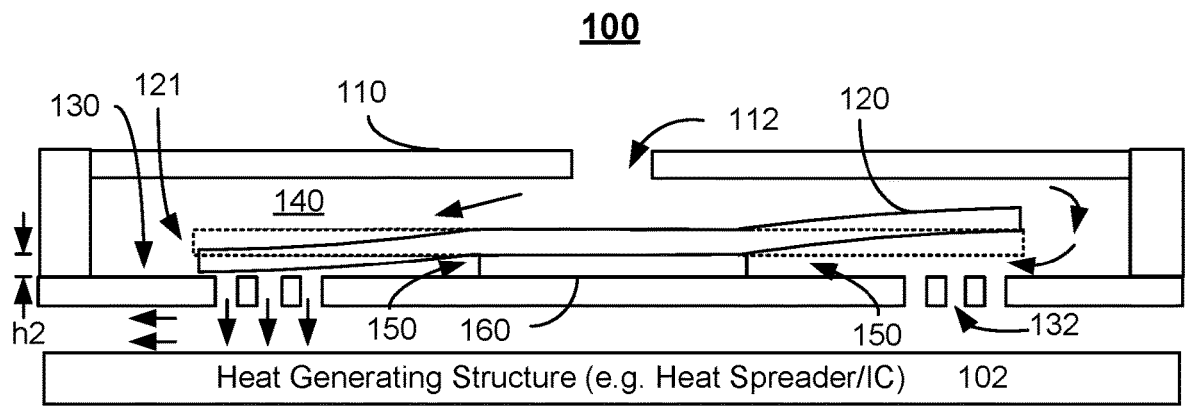
Figure 1E:
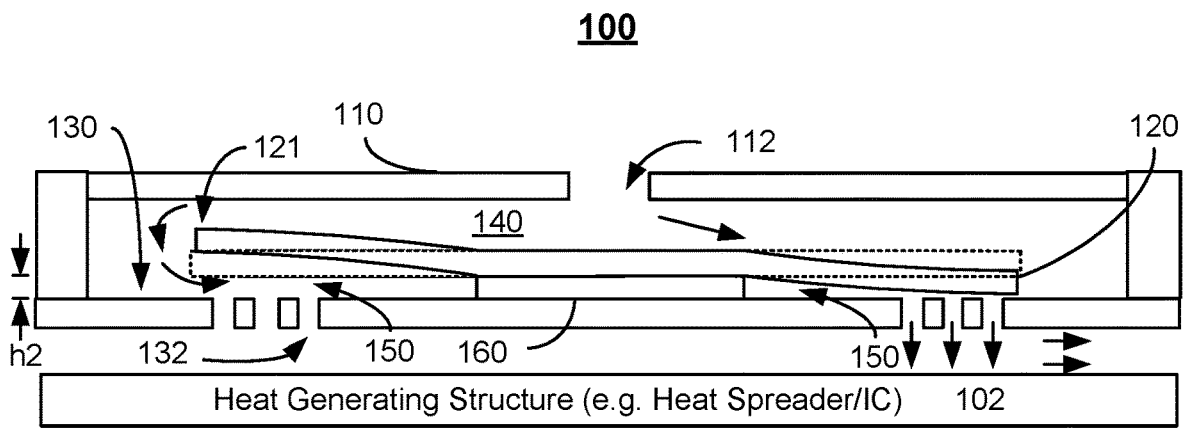
Figure 1F:
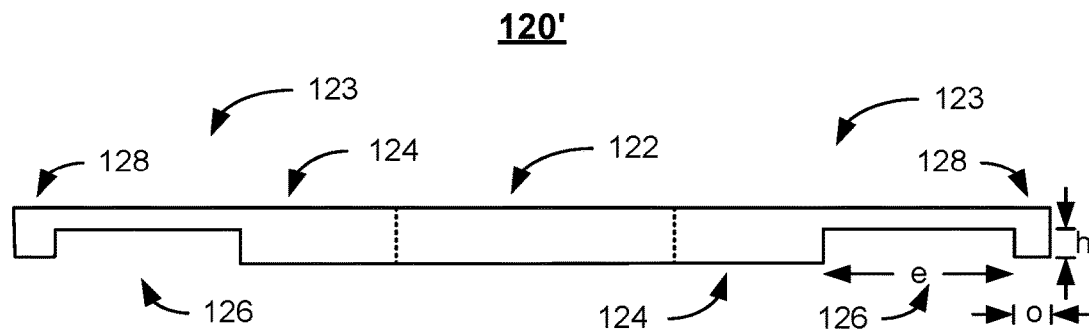

FIGS. 1A-1F are diagrams depicting an exemplary embodiment of active cooling system 100 usable with heat-generating structure 102 and including a centrally anchored cooling element 120 or 120'. Cooling element 120 is shown in FIGS. 1A-1E and cooling element 120' is shown in FIG. 1F. For clarity, only certain components are shown. FIGS. 1A-1F are not to scale. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A.

FIG. 1A depicts cooling system 100 in a neutral position. Thus, cooling element 120 is shown as substantially flat. For in-phase operation, cooling element 120 is driven to vibrate between positions shown in FIGS. 1B and 1C. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electromechanical system (MEMS) cooling system capable of residing within mobile computing devices and/or other devices having limited space in at least one dimension. For example, the total height of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1E). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1E, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1E. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1E) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/50 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2 = n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of cooling element 120, in some embodiments, it is also approximately true that L/2=nλ/4, where λ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 13) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may be a stainless steel, Ni alloy and/or Hastelloy substrate. In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1E. Although described in the context of particular pressures, gap sizes, and timing of flow, operation of cooling system 100 is not dependent upon the explanation herein. FIGS. 1B-1C depict in-phase operation of cooling system 100. Referring to FIG. 1B, cooling element 120 has been actuated so that its tip 121 moves away from top plate 110. FIG. 1B can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1B. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1B.

Cooling element 120 is also actuated so that tip 121 moves away from heat-generating structure 102 and toward top plate 110. FIG. 1C can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1C. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1C. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 10. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1B and 1C is repeated. Thus, cooling element 120 undergoes vibrational motion indicated in FIGS. 1A-1C, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

FIGS. 1D-1E depict an embodiment of active cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. The movement of fluid is shown by unlabeled arrows in FIGS. 1D and 1E.

The motion between the positions shown in FIGS. 1D and 1E is repeated. Thus, cooling element 120 undergoes vibrational motion indicated in FIGS. 1A, 1D, and 1E, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1E, cooling system 100 may utilize cooling elements having different shapes. FIG. 1F depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1F, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 100 to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
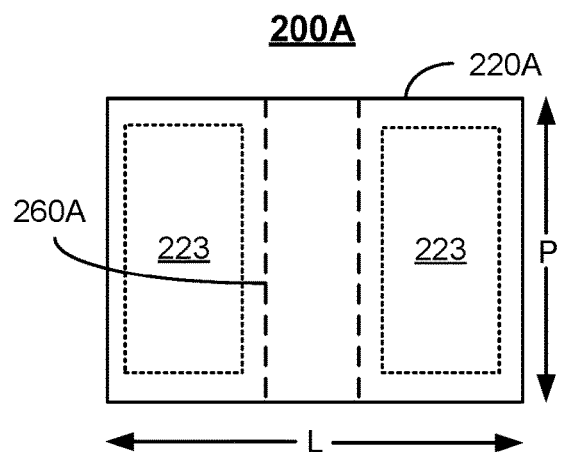
FIGS. 2A-2B depict embodiments of cooling elements usable in active cooling systems including centrally anchored cooling elements.
Figure 2B:
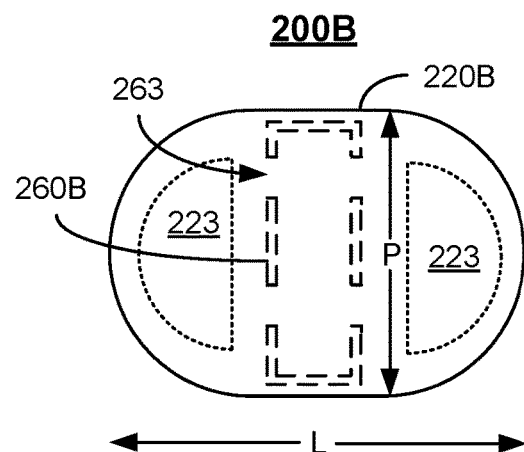

FIGS. 2A-2B depict plan views of embodiments of cooling systems 200A and 200B analogous to active cooling systems such as cooling system 100. FIGS. 2A and 2B are not to scale. For simplicity, only portions of cooling elements 220A and 220B and anchors 260A and 260B, respectively, are shown. Cooling elements 220A and 220B are analogous to cooling element 120/120'. Thus, the sizes and/or materials used for cooling elements 220A and/or 220B may be analogous to those for cooling element 120/120'. Anchors (support structures) 260A and 260B are analogous to anchor 160 and are indicated by dashed lines.

For cooling elements 220A and 220B, anchors 260A and 260B are centrally located and extend along a central axis of cooling elements 220A and 220B, respectively. Thus, the cantilevered portions that are actuated to vibrate are to the right and left of anchors 260A and 260B. In some embodiments, cooling element(s) 220A and/or 220B are continuous structures, two portions of which are actuated (e.g. the cantilevered portions outside of anchors 260A and 260B). In some embodiments, cooling element(s) 220A and/or 220B include separate cantilevered portions each of which is attached to the anchors 260A and 260B, respectively, and actuated. Cantilevered portions of cooling elements 220A and 220B may thus be configured to vibrate in a manner analogous to the wings of a butterfly (in-phase) or to a seesaw (out-of-phase). In FIGS. 2A and 2B, L is the length of the cooling element, analogous to that depicted in FIGS. 1A-1E. Also in FIGS. 2A and 2B, the depth, P, of cooling elements 220A and 220B is indicated.

Also shown by dotted lines in FIGS. 2A-2B are piezoelectric 223. Piezoelectric 223 is used to actuate cooling elements 220A and 220B. In some embodiments, piezoelectric 223 may be located in another region and/or have a different configuration. Although described in the context of a piezoelectric, another mechanism for actuating cooling elements 220A and 220B can be utilized. Such other mechanisms may be at the locations of piezoelectric 223 or may be located elsewhere. In cooling element 220A, piezoelectric 223 may be affixed to cantilevered portions or may be integrated into cooling element 220A. Further, although piezoelectric 223 is shown as having particular shapes and sizes in FIGS. 2A and 2B, other configurations may be used.

In the embodiment shown in FIG. 2A, anchor 260A extends the entire depth of cooling element 220A. Thus, a portion of the perimeter of cooling element 220A is pinned. The unpinned portions of the perimeter of cooling element 220A are part of the cantilevered sections that undergo vibrational motion. In other embodiments, anchor need not extend the entire length of the central axis. In such embodiments, the entire perimeter of the cooling element is unpinned. However, such a cooling element still has cantilevered sections configured to vibrate in a manner described herein. For example, in FIG. 2B, anchor 260B does not extend to the perimeter of cooling element 220B. Thus, the perimeter of cooling element 220B is unpinned. However, anchor 260B still extends along the central axis of cooling element 220B. Cooling element 220B is still actuated such that cantilevered portions vibrate (e.g. analogous to the wings of a butterfly).

Although cooling element 220 A is depicted as rectangular, cooling elements may have another shape. In some embodiments, corners of cooling element 220A may be rounded. Cooling element 220B of FIG. 2B has rounded cantilevered sections. Other shapes are possible. In the embodiment shown in FIG. 2B, anchor 260B is hollow and includes apertures 263. In some embodiments, cooling element 220B has aperture(s) in the region of anchor 260B. In some embodiments, cooling element 220B includes multiple portions such that aperture(s) exist in the region of anchor 260B. As a result, fluid may be drawn through cooling element 220B and through anchor 260B. Thus, cooling element 220B may be used in place of a top plate, such as top plate 110. In such embodiments, apertures in cooling element 220B and apertures 263 may function in an analogous manner to vent 112. Further, although cooling elements 200A and 200B are depicted as being supported in a central region, in some embodiments, one cantilevered section of the cooling element 220A and/or 220B might be omitted. In such embodiments, cooling element 220A and/or 220B may be considered to be supported, or anchored, at or near one edge, while at least part of at least the opposing edge is free to undergo vibrational motion. In some such embodiments, the cooling element 220A and/or 220B may include a single cantilevered section that undergoes vibrational motion.

Figure 3A:
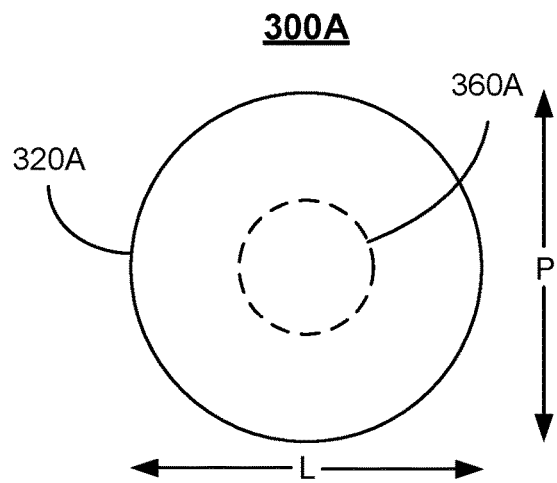
FIGS. 3A-3B depict embodiments of cooling elements usable in active cooling systems including centrally anchored cooling elements.
Figure 3B:
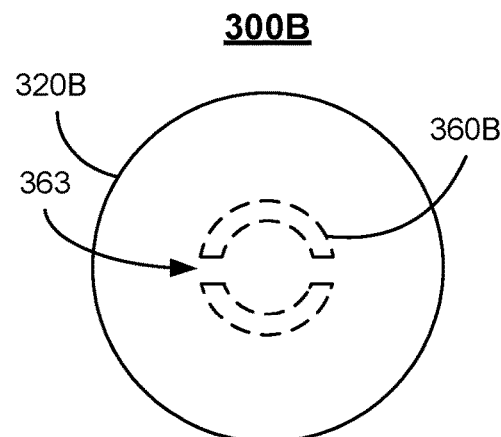

FIGS. 3A-3B depict plan views of embodiments of cooling systems 300A and 300B analogous to active cooling systems such as cooling system 100. FIGS. 3A and 3B are not to scale. For simplicity, only cooling elements 320A and 320B and anchors 360A and 360B, respectively, are shown. Cooling elements 320A and 320B are analogous to cooling element 120/120'. Thus, the sizes and/or materials used for cooling elements 320A and/or 320B may be analogous to those for cooling element 120/120'. Anchors 360A and 360B are analogous to anchor 160 and are indicated by dashed lines.

For cooling elements 320A and 320B, anchors 360A and 360B, respectively, are limited to a central region of cooling elements 320A and 320B, respectively. Thus, the regions surrounding anchors 360A and 360B undergo vibrational motion. Cooling elements 320A and 320B may thus be configured to vibrate in a manner analogous to a jellyfish or similar to the opening/closing of an umbrella. In some embodiments, the entire perimeter of cooling elements 320A and 320B vibrate in phase (e.g. all move up or down together). In other embodiments, portions of the perimeter of cooling elements 320A and 320B vibrate out of phase. In FIGS. 3A and 3B, L is the length (e.g. diameter) of the cooling element, analogous to that depicted in FIGS. 1A-1E. Although cooling elements 320A and 320B are depicted as circular, cooling elements may have another shape. Further, a piezoelectric (not shown in FIGS. 3A-3B) and/or other mechanism may be used to drive the vibrational motion of cooling elements 320A and 320B.

In the embodiment shown in FIG. 3B, the anchor 360B is hollow and has apertures 363. In some embodiments, cooling element 320B has aperture(s) in the region of anchor 360B. In some embodiments, cooling element 320B includes multiple portions such that aperture(s) exist in the region of anchor 360B. As a result, fluid may be drawn through cooling element 320B and through anchor 360B. The fluid may exit through apertures 363. Thus, cooling element 320B may be used in place of a top plate, such as top plate 110. In such embodiments, apertures in cooling element 320B and apertures 363 may function in an analogous manner to vent 112.

Cooling systems such as cooling system 100 can utilize cooling element(s) 220A, 220B, 320A, 320B and/or analogous cooling elements. Such cooling systems may also share the benefits of cooling system 100. Cooling systems using cooling element(s) 220A, 220B, 320A, 320B and/or analogous cooling elements may more efficiently drive fluid toward heat-generating structures at high speeds. Consequently, heat transfer between the heat-generating structure and the moving fluid is improved. Because the heat-generating structure is more efficiently cooled, the corresponding device may exhibit improved operation, such as running at higher speed and/or power for longer times. Cooling systems employing cooling element(s) 220A, 220B, 320A, 320B and/or analogous cooling elements may be suitable for use in smaller and/or mobile devices in which limited space is available. Performance of such devices may thus be improved. Because cooling element(s) 220A, 220B, 320A, 320B and/or analogous cooling elements may be vibrated at frequencies of 15 kHz or more, users may not hear any noise associated with actuation of cooling elements. If driven at or near the acoustic and/or structural resonance frequencies for the cooling element(s) 220A, 220B, 320A, 320B and/or analogous cooling elements, the power used in operating cooling systems may be significantly reduced. Cooling element(s) 220A, 220B, 320A, 320B and/or analogous cooling elements may not physically contact the plates during use, allowing resonance to be more readily maintained. The benefits of improved, quiet cooling may be achieved with limited additional power. Consequently, performance of devices incorporating the cooling element(s) 220A, 220B, 320A, 320B and/or analogous cooling elements may be improved.

Figure 4A:
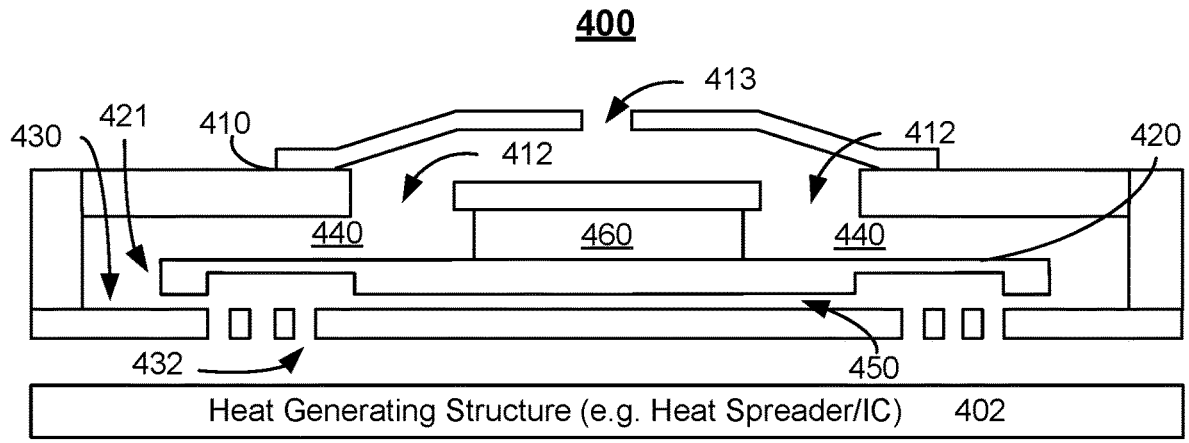
FIGS. 4A-4B depict an embodiment of an active cooling system including a centrally anchored cooling element.
Figure 4B:
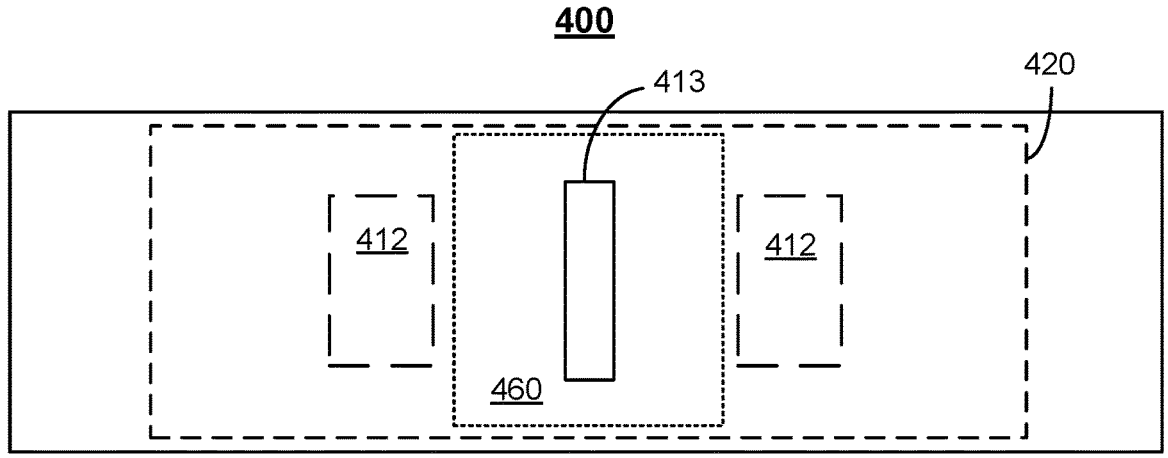

FIGS. 4A-4B depict an embodiment of active cooling system 400 including a top centrally anchored cooling element. FIG. 4A depicts a side view of cooling system 400 in a neutral position. FIG. 4B depicts a top view of cooling system 400. FIGS. 4A-4B are not to scale. For simplicity, only portions of cooling system 400 are shown. Referring to FIGS. 4A-10B, cooling system 400 is analogous to cooling system 100. Consequently, analogous components have similar labels. For example, cooling system 400 is used in conjunction with heat-generating structure 402, which is analogous to heat-generating structure 102.

Cooling system 400 includes top plate 410 having vents 412, cooling element 420, orifice plate 430 including orifices 432, top chamber 440 having a gap, bottom chamber 450 having a gap, flow chamber 440/450, and anchor (i.e. support structure) 460 that are analogous to top plate 110 having vent 112, cooling element 220, orifice plate 130 including orifices 132, top chamber 140 having gap 142, bottom chamber 150 having gap 152, flow chamber 140/150, and anchor (i.e. support structure) 160, respectively. Thus, cooling element 420 is centrally supported by anchor 460 such that at least a portion of the perimeter of cooling element 420 is free to vibrate. In some embodiments, anchor 460 extends along the axis of cooling element 420 (e.g. in a manner analogous to anchor 260A and/or 260B). In other embodiments, anchor 460 is only near the center portion of cooling element 420 (e.g. analogous to anchor 460C and/or 460D). Although not explicitly labeled in FIGS. 4A and 4B, cooling element 420 includes an anchored region and cantilevered arms including step region, extension region and outer regions analogous to anchored region 122, cantilevered arms 123, step region 124, extension region 126 and outer region 128 of cooling element 120'. In some embodiments, cantilevered arms of cooling element 420 are driven in-phase. In some embodiments, cantilevered arms of cooling element 420 are driven out-of-phase. In some embodiments, a simple cooling element, such as cooling element 120, may be used.

Anchor 460 supports cooling element 420 from above. Thus, cooling element 420 is suspended from anchor 460. Anchor 460 is suspended from top plate 410. Top plate 410 includes vent 413. Vents 412 on the sides of anchor 460 provide a path for fluid to flow into sides of chamber 440.

As discussed above with respect to cooling system 100, cooling element 420 may be driven to vibrate at or near the structural resonant frequency of cooling element 420. Further, the structural resonant frequency of cooling element 420 may be configured to align with the acoustic resonance of the chamber 440/1050. The structural and acoustic resonant frequencies are generally chosen to be in the ultrasonic range. For example, the vibrational motion of cooling element 420 may be at the frequencies described with respect to cooling system 100. Consequently, efficiency and flow rate may be enhanced. However, other frequencies may be used.

Cooling system 400 operates in an analogous manner to cooling system 100. Cooling system 400 thus shares the benefits of cooling system 100. Thus, performance of a device employing cooling system 400 may be improved. In addition, suspending cooling element 420 from anchor 460 may further enhance performance. In particular, vibrations in cooling system 400 that may affect other cooling cells (not shown), may be reduced. For example, less vibration may be induced in top plate 410 due to the motion of cooling element 420. Consequently, cross talk between cooling system 400 and other cooling systems (e.g. other cells) or other portions of the device incorporating cooling system 400 may be reduced. Thus, performance may be further enhanced.

Figure 5A:
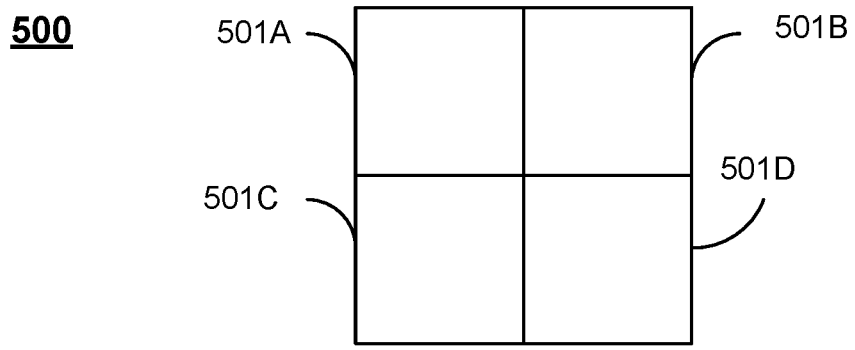
FIGS. 5A-5E depict an embodiment of an active cooling system formed in a tile.
Figure 5B:
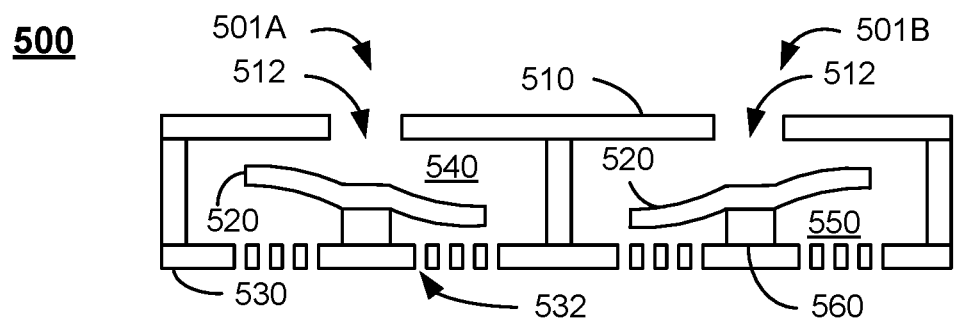
Figure 5C:
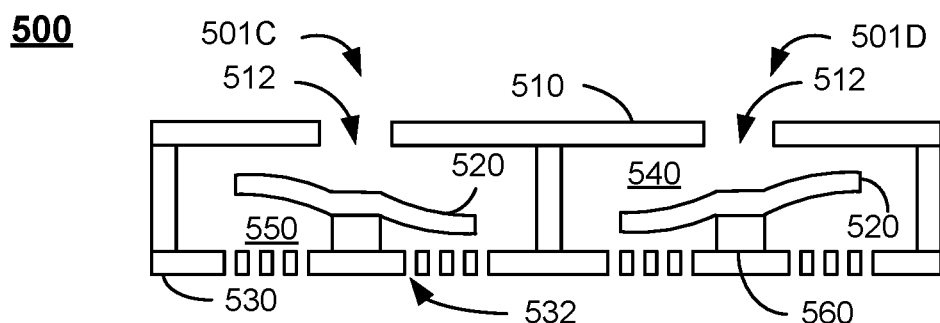
Figure 5D:
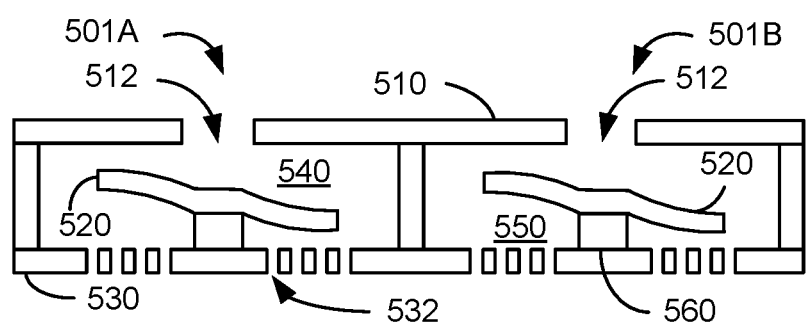
Figure 5E:
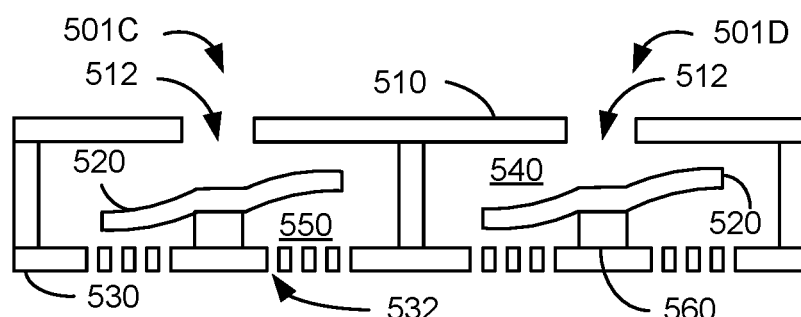

FIGS. 5A-5E depict an embodiment of active cooling system 500 including multiple cooling cells configured as a tile, or array. FIG. 5A depicts a top view, while FIGS. 5B-5E depict side views. FIGS. 5A-5E are not to scale. Cooling system 500 includes four cooling cells 501A, 501B, 501C and 501D (collectively or generically 501), which are analogous to one or more of cooling systems described herein. More specifically, cooling cells 501 are analogous to cooling system 100 and/or 400. Although four cooling cells 501 in a 2×2 configuration are shown, in some embodiments another number and/or another configuration of cooling cells 501 might be employed. In the embodiment shown, cooling cells 501 include shared top plate 510 having apertures 512, cooling elements 520, shared orifice plate 530 including orifices 532, top chambers 540, bottom chambers 550 and anchors (support structures) 560 that are analogous to top plate 110 having apertures 112, cooling element 120, orifice plate 130 having orifices 132, top chamber 140, bottom chamber 150 and anchor 160. In some embodiments, cooling cells 501 may be fabricated together and separated, for example by cutting through top plate 510, side walls between cooling cells 501, and orifice plate 530. Thus, although described in the context of a shared top plate 510 and shared orifice plate 530, after fabrication cooling cells 501 may be separated. In some embodiments, tabs (not shown) and/or other structures such as anchors 560, may connect cooling cells 501. Further, tile 500 may be affixed to a heat-generating structure (e.g. a heat sink, integrated circuit, or other structure) that may be part of an integrated system including tile 500 or may be separate from tile 500. In addition, a hood or other mechanism for directing fluid flow outside of cooling cells 501, mechanical stability, or protection may also be included. Electrical connection to cooling cells 501 is also not shown in FIGS. 5A-5E. Cooling elements 520 are driven out-of-phase (i.e. in a manner analogous to a seesaw). Further, as can be seen in FIGS. 5B-5C and FIGS. 5D-5E cooling element 520 in one cell is driven out-of-phase with cooling element(s) 520 in adjacent cell(s). In FIGS. 5B-5C, cooling elements 520 in a row are driven out-of-phase. Thus, cooling element 520 in cell 501A is out-of-phase with cooling element 520 in cell 501B. Similarly, cooling element 520 in cell 501C is out-of-phase with cooling element 520 in cell 501D. In FIGS. 5D-5E, cooling elements 520 in a column are driven out-of-phase. Thus, cooling element 520 in cell 501A is out-of-phase with cooling element 520 in cell 501C. Similarly, cooling element 520 in cell 501B is out-of-phase with cooling element 520 in cell 501D. By driving cooling elements 520 out-of-phase, vibrations in cooling system 500 may be reduced.

Cooling cells 501 of cooling system 500 functions in an analogous manner to cooling system(s) 100, 400, and/or an analogous cooling system. Consequently, the benefits described herein may be shared by cooling system 500. Because cooling elements in nearby cells are driven out-of-phase, vibrations in cooling system 500 may be reduced. Because multiple cooling cells 501 are used, cooling system 500 may enjoy enhanced cooling capabilities. Further, multiples of individual cooling cells 501 and/or cooling system 500 may be combined in various fashions to obtain the desired footprint of cooling cells.

Figure 6:
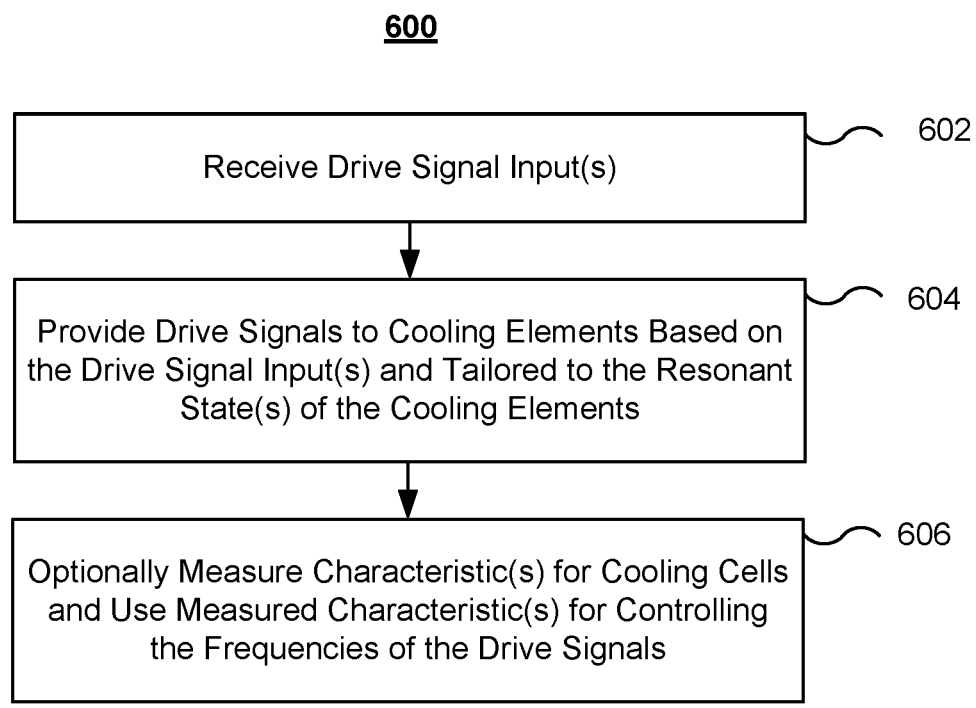
FIG. 6 is a flow chart depicting an embodiments of a method for driving active cooling systems including multiple cooling elements.

FIG. 6 is a flow chart depicting an exemplary embodiment of method 600 for operating a cooling system. Method 600 may include steps that are not depicted for simplicity. Method 600 is described in the context of piezoelectric cooling system (tile) 500. However, method 600 may be used with other cooling systems including but not limited to systems and cells described herein. For example, method 600 may be used to control multiple tiles 500. Thus, method 600 might be used to drive cooling elements for eight, twelve, or sixteen cooling elements. In some embodiments, method 600 may be used for another configuration of cooling cells. For example, method 600 may be used for a triangular array of ten cooling cells (not shown).

One or more drive signal inputs are received for the cooling elements, at 602. In some embodiments, the phase, frequency, and amplitude of each drive signal input may be independently controlled. Further, where multiple drive signal inputs are used, at least the frequency and/or phase of individual drive signal inputs may differ. The frequencies, amplitudes, and phases of the drive signal inputs may be determined during calibration of the cooling cells or via auto-tuning. For example, a current versus frequency sweep may be performed for each cooling cell.

Based on the drive signal input(s), one or more drive signals are provided to multiple cells and, therefore, to multiple cooling elements, at 604. For example, the cooling cells may be organized into tiles, such as tile 500. In some such embodiments, a single drive signal is provided to each tile. Stated differently, a single drive signal causes all of the cooling elements in the tile to vibrate. Thus, a drive signal energizes the cooling element 520 in all cooling cells 501 of each tile 500. In some embodiments, multiple drive signals may be provided to a tile. Each cooling element 520 in the tile 500 (or subsets of cooling elements 520 in the tile 500) may be driven by a separate drive signal. The drive signals may be currents, voltages, or other electrical signals configured to induce vibration in the cooling elements. The drive signals may cause piezoelectric layer(s) in, on, or near the cooling element to move. Consequently, the cooling elements may be actuated to undergo vibrational motion, such as the motion described in for cooling elements 120, 220, 420 and/or 520. Because a particular drive signal may be provided to multiple cooling elements, a large number of cooling elements may be energized at 604 using a limited number of drive signal inputs.

In some embodiments, each drive signal input is simply routed to the appropriate cooling cell(s) at 604. In some embodiments, the drive signal inputs are further processed at 604 to adjust the phase, frequency, and/or amplitude and provide a drive signal that differs from the drive signal input. In some embodiments, the frequency of a drive signal provided to a particular cooling element corresponds to the resonant state of the cooling element. The resonant state of a cooling element is characterized by a resonant frequency. The resonant frequency may be a structural resonant frequency and/or a fluidic resonant frequency. The cooling cell and cooling element therein may be designed such that the fluidic resonant frequency and the structural resonant frequency are the same or with in a particular tolerance, such as three percent, five percent, ten percent, or twenty percent. Consequently, as used herein, the resonant frequency of a cooling element may be the structural and/or fluidic resonant frequency. In some embodiments, the frequency of the drive signal is equal to the resonant frequency of the cooling elements. In some embodiments, the frequency of the drive signal is within a threshold of the resonant frequency. For example, the frequency may be within ten percent of a resonant frequency of the cooling element. In some embodiments, the frequency is within three percent, five percent, or twenty percent of a resonant frequency of the corresponding cooling element. Similarly, if a drive signal is used to drive multiple (e.g. all) cooling elements in a tile, the frequency of the drive signal is within a threshold of the resonant frequency/frequencies of some or all of the cooling elements in the tile. For example, the frequency may be within ten percent of a resonant frequency/frequencies of the cooling element(s) of the tile. In some embodiments, the frequency is within three percent, five percent, or twenty percent of resonant frequency/frequencies of the cooling element(s) of the corresponding tile. Thus, at 604, multiple cooling elements in multiple cooling cells are driven at or near resonance. Also at 604 the phase of the driving signals are controlled. As a result, the relationship between the vibrational motion of different cooling elements may be controlled. For example, the phase may be selected so that adjacent cooling elements are driven out-of-phase. In some embodiments, the amplitude of the drive signal is controlled at 604 to ensure that the motion of the cooling elements is such that the cooling element does not contact the top plate or orifice plate.

In some embodiments, characteristics of the cooling cell(s) (or cooling element(s)) are measured and used to control the drive signals, at 606. Thus, the drive signals may be dynamically controlled via feedback at 606. For example, in some embodiments, the current used in driving one or more cooling elements is measured. In some embodiments, the drive signal may be a voltage signal. In such embodiments, the voltage driving one or more of the cooling elements is measured. As the frequency of the driving signal nears the resonant frequency of the cooling element, the driving current may be reduced for a given amplitude of vibration. Thus, a change in the measured current or voltage drawn by the cooling element indicates the cooling element is closer to resonance. The drive signal may be updated such that the cooling elements being driven remain at or near resonance.

For example, method 600 may be used in driving cooling elements 520 in the manner shown in FIGS. 5B-5C. Cooling elements 520 in cells 501 are generally desired to have the same resonant state. However, because of processing or other variations, the cooling elements may have different resonant frequencies. Further, during use, the resonant frequency of a cooling element 520 may change. Suppose cooling elements 520 in cooling cells 501A and 501C have a first resonant frequency, while cooling elements 520 in cooling cells 501B and 501D have a second resonant frequency. In addition, cooling element 520 of cooling cell 501A is desired to vibrate approximately one hundred and eighty degrees out-of-phase with cooling element 520 of cooling cell 501B. Similarly, cooling element 520 of cooling cell 501C is desired to vibrate approximately one hundred and eighty degrees out-of-phase with cooling element 520 of cooling cell 501D. The frequencies and phases for cooling elements 520 may be determined via auto-tuning. For example, each cooling element may be driven, the current or other characteristic(s) measured, and the resonant frequency determined. In addition, two drive signal inputs may be used for the four cells 501.

At 602, the two drive signal inputs having particular frequencies, amplitudes, and phases are received. For example, suppose the two drive signal inputs are one hundred and eighty degrees out-of-phase and that a first drive signal input has a frequency at or near the resonant frequency for cooling cells 501A and 501C, while the second drive signal input has a frequency at or near the resonant frequency for cooling cells 501B and 501D. At 604, the first drive signal input is provided as a drive signal to cooling cells 501A and 501C, while the second drive signal input is provided as a drive signal to cooling cells 501B and 501D.

At 606, the drive signals, amplitude of vibration, or other characteristic(s) for cooling elements 520 of cooling cells 500 are measured. Changes in the characteristic(s) measured indicate that the cooling element(s) 520 are deviating from resonance. Adjustments made at 606 allow the drift in resonant frequency to be accounted for. For example, the frequency of the drive signal may be swept and the current drawn measured at 606. The maximum drive current for the cooling element(s) 520 corresponds to resonance. The drive signal input and/or drive signal may be adjusted to be at or within the threshold of this frequency and method 600 repeated. Thus, the efficiency of cooling elements 520 in driving fluid flow through cooling cells 501 and onto a heat-generating structure may be maintained.

In another example, method 600 may be used to provide a single drive signal to all cooling elements 520 in tile 500. Further, multiple tiles 500 may be driven. Method 600 may thus provide different drive signals to different tiles 500.

At 602, the drive signal inputs having particular frequencies and phases are received. The initial frequency for each tile 500 may be determined via auto-tuning. Thus, each tile 500 may initially be separately (e.g. sequentially) driven at various frequencies (e.g. through a frequency sweep), the current drawn or other characteristic(s) measured, and the appropriate frequency corresponding to resonance for each tile 500 determined. The initial frequencies of the drive signal are thus determined. These correspond to the drive signal inputs receive at 602. At 604, a drive signal having the appropriate frequency is provided to each tile 500. In some embodiments, 604 may include simply routing the appropriate drive signal input to the corresponding tile 500. In other embodiments, 604 include some additional signal processing to provide the drive signal to the appropriate tile.

At 606, the drive signals, amplitude of vibration, or other characteristic(s) for tiles 500 are measured. In some embodiments, tiles 500 are individually driven in sequence and the corresponding drive signal measured by a current monitor or a voltage monitor. In some embodiments, multiple current or voltage monitors may be used and tiles 500 may be driven in parallel. For example, the frequency of the drive signal for a tile 500 may be swept, the current measured, and the frequency at which the maximum current drawn determined. The frequency is adjusted at 606 to at or within a threshold of this frequency. Adjustments made at 606 allow the drift in resonant frequency to be accounted for. Thus, the efficiency of tile 500 in driving fluid may be maintained.

Consequently, cooling elements, such as cooling element(s) 520 may be operated at or near resonance. Method 600 thus provides for use of piezoelectric cooling systems including multiple cooling cells. Thus, piezoelectric cooling systems may more efficiently and quietly cool semiconductor devices at lower power. Further, a reduced number of drive signal inputs may be used in providing drive signals to the cooling cells. For example, the number of drive signal inputs may be less than the number of cooling cells being driven. Consequently, design of the interconnect and other structures providing power to the cooling cells may be simplified while maintaining control over the cells.

Figure 7:
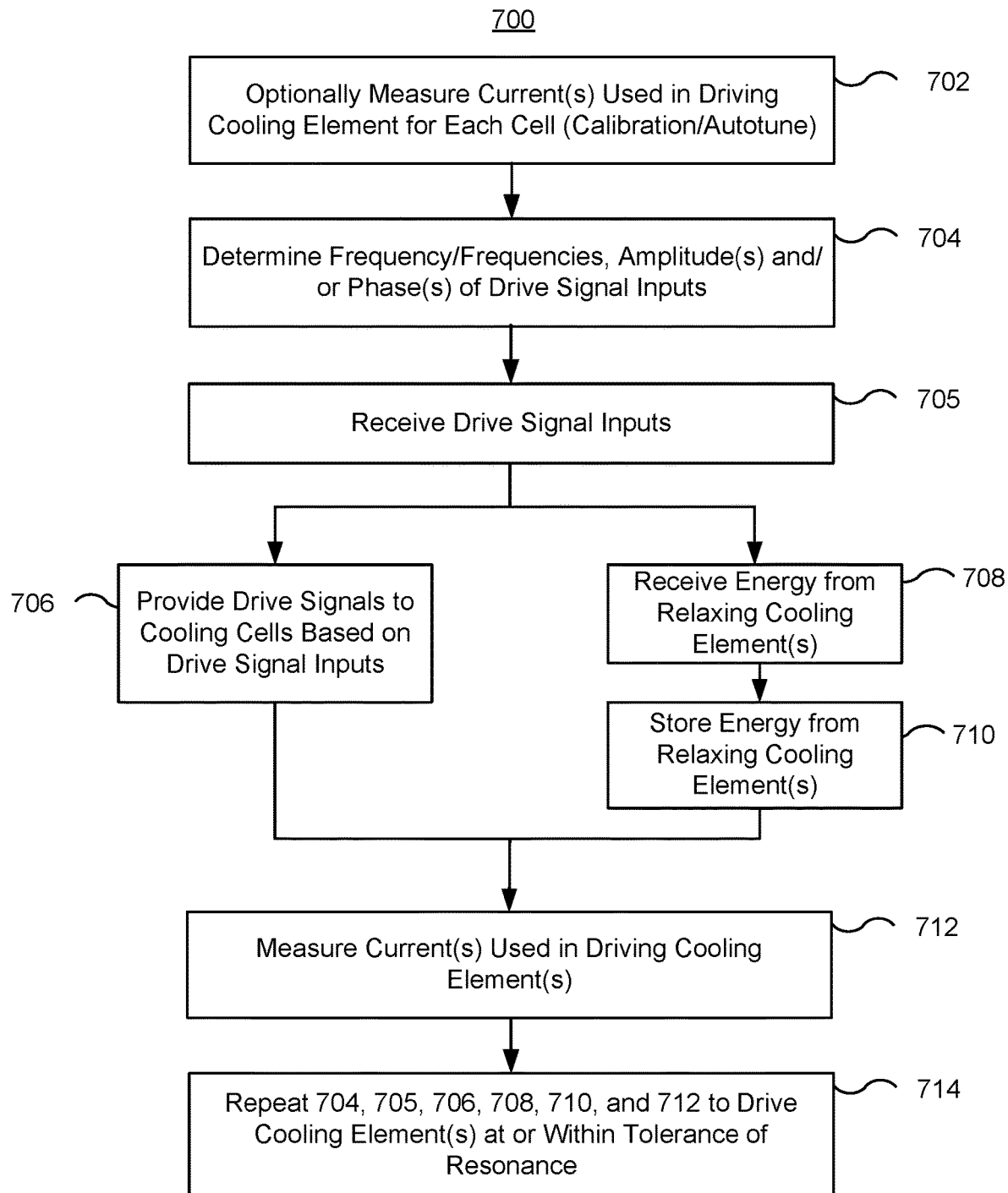
FIG. 7 is a flow chart depicting an embodiments of a method for driving active cooling systems including multiple cooling elements.

FIG. 7 is a flow chart depicting an exemplary embodiment of method 700 for operating a cooling system. Method 700 may include steps that are not depicted for simplicity. Method 700 is described in the context of piezoelectric cooling system 500. However, method 700 may be used with other cooling systems including but not limited to systems and cells described herein.

The current(s) used in driving the cooling element(s) are measured for various frequencies in a calibration (or autotune) phase, at 702. The driving frequencies, amplitudes, phases, and/or other characteristics of the drive signal input(s) are determined, at 704. For example, at 704 the frequencies of the drive signal inputs may be selected to match the resonant frequencies of subsets of the cooling elements or tiles. The amplitudes of the drive signals may be selected to ensure that the maximum deflection of the cooling elements is such that the cooling element does not contact portions of the cell, such as the orifice plate or top plate. The drive signal inputs are received at 705. The drive signals are provided to the cooling cells based on the drive signal inputs, at 706. The cooling cells may be driven using a current or voltage at 706. Thus, 705 and 706 are analogous to 602 and 604 of method 600. In some embodiments, 706 is performed by organizing the cooling elements or tiles into bins based on their resonant frequencies. Each bin corresponds to a drive signal having a particular frequency and, in some embodiments, a particular phase. Thus, cooling elements/tiles having resonant frequencies that are similar are placed in the same bin. At 706, the cooling elements/tiles for each bin are driven using the drive signal corresponding to the bin.

During operation of cooling elements, the actuators undergo vibrational motion. The vibrational motion includes a driving phase and a relaxation phase. In the driving phase, energy is input to a cooling element so that the cooling element deflects. In the relaxation phase, the cooling element deflects back toward, and sometimes through, the neutral position. Thus, energy can be received from the relaxing cooling elements, at 708. This energy is stored for later use, at 710. Alternatively, some or all of the energy received at 708 may be used substantially immediately at 710. For example, the stored energy may be used in driving the cooling elements.

The current(s) or voltage(s) used in driving the cooling elements are measured, at 712. In some embodiments, other characteristics of the cooling elements are measured at 712. At 714, 704, 705, 706, 708, 710 and 712 may be repeated. Thus, the drive signal inputs may be updated using the measured current at 704, the drive signal inputs received, the drive signals provided to energize the cooling cells at 705 and 706, some energy in the cooling elements recycled at 708 and 710, and the current driving the cooling element(s) re-measured. Thus, at 714, feedback may be used to dynamically update the drive signals during operation. The cooling elements may be operated at or near resonance.

Method 700 thus provides for use of active cooling systems including multiple cooling cells. Cooling elements, such as cooling element(s) 520 may also be operated at or near resonance. Thus, cooling systems may more efficiently and quietly cool semiconductor devices at lower power. Further, a reduced number of drive signal inputs may be used in providing drive signals to the cooling cells. Consequently, design of the interconnect and other structures providing power to the cooling cells may be simplified while maintaining control over the cells. The motion of the cooling elements may also be used to recapture some portion of the energy input to the cooling system in driving the cooling elements. Moreover, 708 and 710 of method 700 may be used in connection with other method(s) (not shown) for driving cooling elements. Stated differently, recapture of energy from the motion of cooling elements may be extended to other techniques used in driving cooling elements. Thus, efficiency of a system utilizing method 700 (or 708 and 710 alone) may be further improved.

Figure 8:
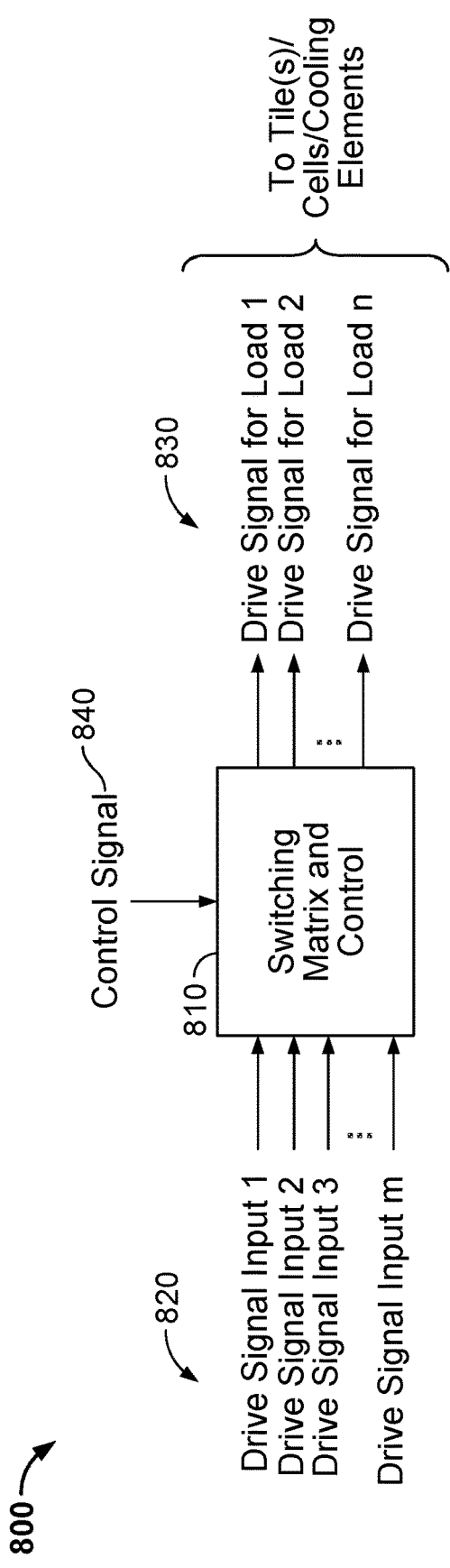
FIG. 8 depicts an embodiment of a system used in driving cooling elements in an embodiment of a cooling system.

Cooling elements may be driven, for example using method(s) 600 and/or 700, utilizing circuitry coupled with cooling cells. FIG. 8 depicts an embodiment of system 800 used in driving cooling elements in an embodiment of a cooling system. System 800 includes switching and control module 810, drive signal inputs 820, control signal 840 and drive signals 830 for cooling elements of cooling cells/systems (not shown in FIG. 8). Thus, switching and matrix control module 810 may be viewed as being coupled with cooling elements in cooling cells, such as a tile, via lines for drive signals 830. Switching and matrix control may also be coupled with a power source via drive signal inputs 820. For example, switching and control module 810 may be connected with cooling system 100, 400, and/or 500 (e.g. cooling cells 501) and the cooling elements 120, 120', 420, and/or 520 used therein.

Switching and control module 810 is shown as coupled with and providing drive signals 830 for n loads (indicated as "Drive Signal for Load" in FIG. 8, where n is the number of loads—e.g. cooling elements or tiles). Thus, n cooling elements or n tiles may be driven using switching and control module 810. For example, for cooling system 500, n=4. Thus, the four cooling elements 520 may be individually driven. In some embodiments, multiple tiles 500 may be driven using system 800. In such embodiments, for n=4, four tiles may be individually driven. Also shown are m drive signal inputs 820. In some embodiments, m=4. However, in other embodiments, another number of drive signal inputs may be used. Each of the drive signals 830 provided to the cooling elements/tiles has a frequency, amplitude, and a phase for a corresponding cooling element or cooling element(s) of a tile. In some embodiments, the frequency is within ten percent of a resonant frequency of the corresponding cooling element(s). In some embodiments, the frequency is within five percent of a resonant frequency of the corresponding cooling element(s). In other embodiments, the frequency of the drive signal 830 provided may be different. Further, the phase of the drive signals 830 to cooling elements may differ. For example, adjacent cooling elements may be desired to be driven by signals that are one hundred and eighty degrees out of phase. Individual cooling elements may also be driven so that the cantilevered arms vibrate out-of-phase (e.g. as shown in FIGS. 1D-1E). The frequency and phase of the drive signals provided to the cooling elements may be determined via a control signal provided to switching and control matrix 810. More specifically, the control signal may be used for selecting the frequency (or frequencies) and phase(s) for a particular cooling element. In some embodiments, the frequencies and phases may be determined based on current versus frequency sweep data obtained during calibration of the cooling elements. In some embodiments, system 800 may auto-tune the frequencies and may utilize the auto-tuning as the control signal for switching and control module 810.

Switching and control module 810 also receives drives signals inputs 820. In the embodiment shown, m drive signal inputs are received. For example, m=4 in some embodiments. Each drive signal input 820 may be independent and allow for amplitude, frequency, and phase control. The amplitude, frequency and phase for each drive signal input 820 may thus be separately controlled. Further, the amplitude, frequency, and phase of the drive signals 830 provided to the cooling elements may be controlled. As a result, the amplitude, frequency and phase of vibration of the cooling elements may also be controlled.

In some embodiments, switching and control module 810 also selects which of the m drive signal inputs is provided to each of the n cooling elements as a drive signal. This routing of drive signal inputs 820 to output drive signals 830 may be determined by control signal 840. In some embodiments, therefore, switching and control module 810 performs binning of the frequency for each of the drive signals. Cooling cells or their tiles are binned based on the acoustic and/or structural resonant frequency for the cooling cells. Cooling cells having similar resonant frequencies are binned to be driven by a drive signal corresponding to the same drive signal input. For example, drive signal input 1 may provide the drive signal for all cooling cells in a first bin of similar frequencies close to the frequency of drive signal input 1. Drive signal input 2 may provide the drive signal for all cooling cells in a second bin have frequencies close to drive signal input 2. Cooling cells are similarly binned for drive signal input 3 through drive signal input m. For embodiments in which drive signals are provided per tile, tiles may be similarly binned based upon the resonant frequencies of the cooling elements therein. In some embodiments, the resonant frequency of a tile corresponds to the maximum current drawn by the tile during a frequency sweep. Optimization of this binning may reduce transfer of vibrational energy from the cooling elements to the device in which the cooling system is utilized. For example, transmission of vibrations from the cooling elements to the host board of the system in which the cooling elements are incorporated may be reduced or prevented. Thus, cooling elements may be controlled and benefits described herein achieved without significant adverse effects to the device in which the cooling element(s) are incorporated.

For example, some embodiments include are four drive signal inputs (m=4) for eight cooling cells (n=8, e.g. for two tiles 500). Drive signal input 1 may provide the drive signal for two cooling cells in the first bin. Drive signal input 2 may provide the drive signal for one cooling cell in the second bin. Drive signal input 3 may provide the drive signal for two cooling cells in the third bin. Drive signal input 4 may provide the drive signal input for three cooling cells in the fourth bin. The cooling cells for a particular bin can, but need not be part of the same tile. The drive signal inputs 1, 2, 3, and 4 may be further manipulated by the control signal provided to switching matrix and control 801. For example, the phase of particular drive signal input(s) may be manipulated by switching matrix and control 810. The manipulated drive single inputs are routed to the appropriate load/cooling element by switching matrix and control 801. Consequently, the appropriate drive signals for each of the eight tiles are output by switching an control matrix 810. Thus, each cell (and cooling element(s) therein) of each tile may be driven at the appropriate frequency, amplitude, and phase. Performance of the cooling cells and, therefore, the systems being cooled may be enhanced.

Figure 9:
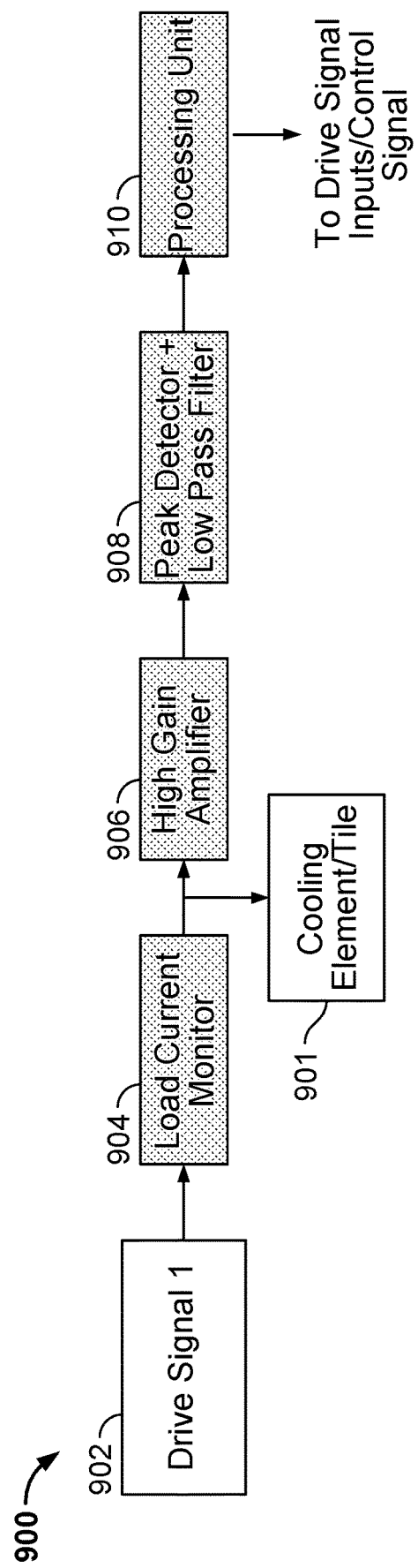
FIG. 9 depicts an embodiment of a system used in determining the resonant frequency for a cooling element or tile.

FIG. 9 depicts an embodiment of system 900 used in determining the resonant frequency for a cooling element or tile. System 900 may thus be incorporated in system 800. For example, load current monitor 904 may be part of switching matrix and control 810. Additional circuitry (not explicitly shown) may also be present. System 900 may be used to for a particular drive signal and/or a particular cooling element or tile. System 900 is, therefore, shown in the context of drive signal 1. However, system 900 or an analogous system may be used for each of the remaining drive signal inputs, tiles and/or cooling elements or each of the drive signals, tiles, and/or cooling elements may be selectively connected to system 900.

Drive signal 1 902, which may correspond to a drive signal 830 (e.g. drive for load 1) of FIG. 8, is provided to load current monitor 904. Load current monitor 904 monitors the current in the drive signal provided to cooling element/tile 901. Cooling cell/tile 901 may be analogous to cooling cells 100, 400, and/or 501 or tile 500. Further, impedance matching for the load (cooling element, etc.) may also be performed to improve performance. The drive current is provided to the cooling element/tile 901 (i.e. the load for system 900). Thus, the cooling element may be driven at the desired frequency. The output of load current monitor 904 is also provided to high gain amplifier 906, and then peak detector 908 and low pass filter 910. The output of load current monitor 904 indicates a deviation of the frequency from a resonant frequency of the corresponding cooling element/tile 901. Processor 910 (i.e. processing unit) detects the resonant frequency of cooling element/tile 901 by tracking the output of load current monitor 904. In some embodiments, the resonant frequency occurs at the maximum current detected by load current monitor 904. There may be a slight phase differences between cooling cells/tiles 901 for maximum flow. Consequently, these phase differences may be adjusted. The modifications depend on factors such as the quality factor for the cooling cell and the effective impedance in the corresponding circuit. Thus, the resonant frequency, and deviations therefrom, for the cooling element/tile 901 may be detected during use. Consequently, the frequency of the signal used to drive the cooling element may be adjusted. In the embodiment shown, therefore, processing unit 910 may be used to control drive signal inputs (e.g. drive signal inputs 820 of system 800) and/or control signals (e.g. control signal 840 of system 800) Thus, changes in the resonant frequency of the cooling element, for example due to temperature or structural changes during use, may be accounted for.

Figure 10:
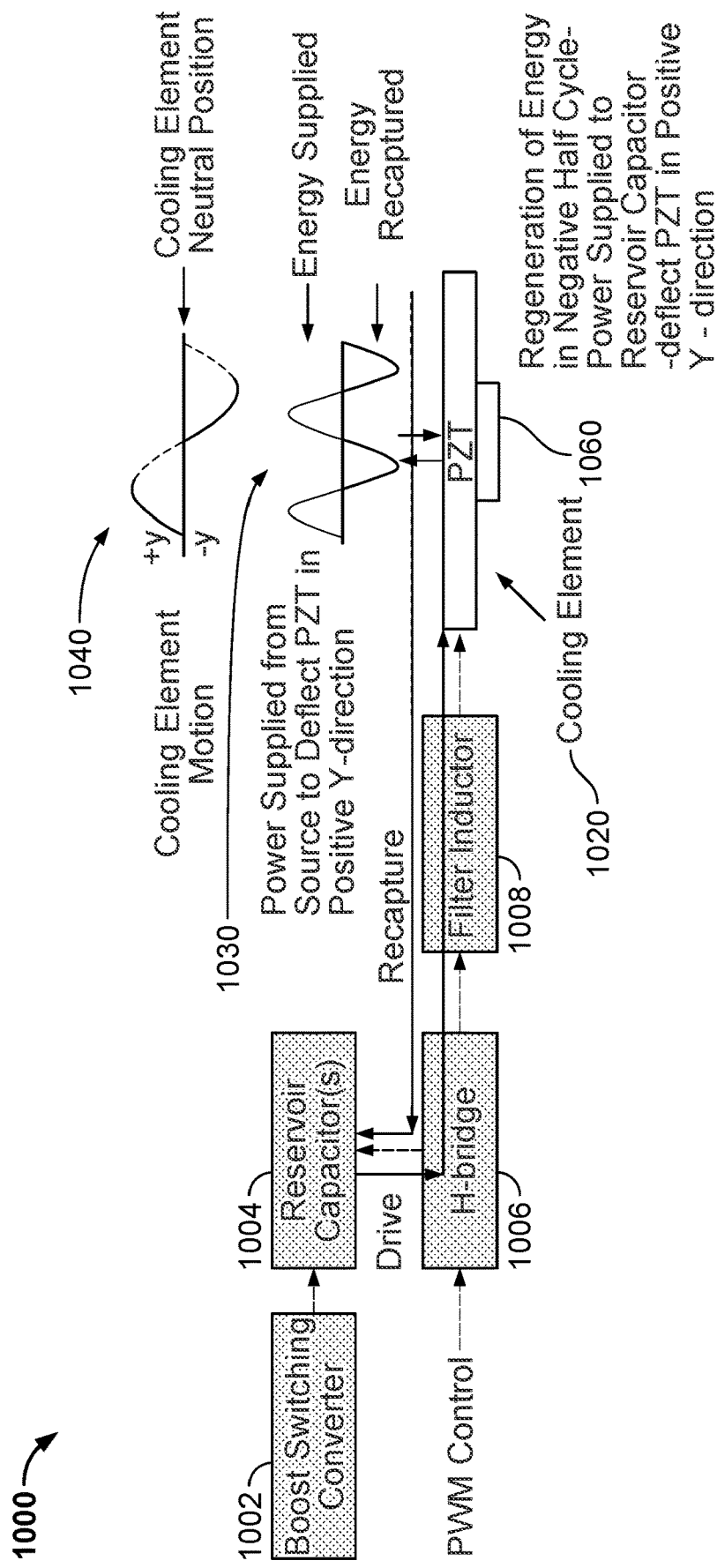
FIG. 10 depicts an embodiment of a system that utilizes motion of the cooling element for energy.

FIG. 10 depicts an embodiment of energy regenerator system 1000 that utilizes motion of the cooling element for energy. Energy regenerator system 1000 may be incorporated into system 800 or be utilized in conjunction with system 800. Additional circuitry (not explicitly shown) may also be present. Energy regenerator system 1000 is described in the context of a particular cooling element. However, energy regenerator system 1000 or an analogous system may be used for each/all cooling elements. Also shown in FIG. 10 is cooling element 1020, which is can be driven with its cantilevered sections in phase or out-of-phase.

Energy regenerator system 1000 is used to recapture some portion of the energy used in driving cooling element 1020. Energy regenerator system 1000 may also be used to drive cooling element 1020To do so, energy regenerator system 1000 includes filter inductor 1008, H-bridge 1006, reservoir capacitor(s) 1004 for storing energy, and a boost switching converter 1002. Also shown is pulse width modulation (PWM) control input. As can be seen by the motion graph 1030 and energy supplied graph 1040, energy is supplied for part of the motion of the cooling element. Thus, energy from reservoir capacitor 1004 (and optionally another source) is provided via H-bridge 1006 and filter inductor 1008 to cooling element 1020. This may be considered to be a drive signal. The flow of energy to cooling element is shown by arrows from reservoir capacitor 1004, through H-bridge 1006 and filter inductor 1008. The energy supplied by the drive signal deflects the piezoelectric (PZT)/cooling element 1020 and causes the cantilevered sections of cooling element 1020 to vibrate away from the neutral position (e.g. to move in the positive y or negative y direction from the neutral position). This may be considered a driving phase and is shown in the solid lines/upper half of graphs 1030 and 1040 in FIG. 10.

As cooling element 1020 relaxes back to the neutral position, in the negative half of the cycle, energy may be recaptured. This may be considered the relaxation phase and is shown by dashed lines of graph 1040/bottom half of graph 1030. The energy may be considered received by filter inductor 1008, which may reduce high frequency components of the recaptured energy. The recaptured energy is provided to H-bridge 1006, which accounts for the change in polarity of the energy flow. In some embodiments, the recaptured energy is stored in the reservoir capacitor(s) 1004. However, the energy may be stored in another manner. This flow of energy is shown by the arrows from the region of cooling element 1020, through filter inductor 1008 to H-bridge 1006 and reservoir capacitor 1004. Using energy regeneration system 1000, some of the energy used in driving cooling element 1020 may be recaptured. Efficiency of operation of the cooling element and, therefore, the cooling cells and/or systems in which the cooling element is used, may be improved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
    a plurality of cooling cells including a plurality of cooling elements configured to be actuated to induce vibrational motion to drive a fluid toward a heat-generating structure; and
    a switching and control module coupled to the plurality of cooling elements and providing a drive signal to the plurality of cooling elements based on at least one drive signal input, the drive signal having a frequency corresponding to at least one cooling element of the plurality of cooling elements, the frequency corresponding to a resonant state of the at least one cooling element.

2. The system of claim 1, wherein at least a portion of the plurality of cooling cells are separated into a tile and wherein the drive signal is provided to the tile.

3. The system of claim 1, wherein the plurality of cooling cells is in a tile, the drive signal being provided to all cooling cells in the tile.

4. The system of claim 1 wherein the frequency of the drive signal is within at least ten percent of a resonant frequency corresponding to the resonant state.

5. The system of claim 1, wherein the frequency corresponds to a tile resonant state.

6. The system of claim 1, wherein the switching and control module further includes:
    at least one current monitor for the plurality of cooling elements, an output of the at least one current monitor indicating a deviation of the frequency from a resonant frequency of the at least one cooling element such that the drive signal is adjusted based on the deviation.

7. The system of claim 1, wherein the vibrational motion includes a driving phase and a relaxation phase, the system further comprising:
    at least one energy regenerator coupled with the plurality of cooling elements and with the switching and control module, the at least one energy regenerator configured to receive power from the plurality of cooling elements due to the relaxation phase of the vibrational motion.

8. The system of claim 1, wherein the frequency corresponds to at least one of a structural resonant frequency for the at least one cooling element and an acoustic resonant frequency for the at least one cooling element.

9. A system, comprising:
    a plurality of cooling cells including a plurality of cooling elements configured to be actuated to induce vibrational motion to drive a fluid toward a heat-generating structure; and
    a switching and control module including at least one signal input for receiving at least one drive signal input, at least one control signal input, and a plurality of outputs coupled to the plurality of cooling elements, at least one output of the plurality of outputs providing at least one drive signal to the plurality of cooling elements based on the at least one drive signal input and based on a control signal provided to the at least one control signal input, the at least one drive signal having at least one frequency corresponding to a resonant state of a cooling element of the plurality of cooling elements.

10. The system of claim 9, wherein the switching and control module further includes:
    at least one current monitor, an output of each of the at least one current monitor indicating a deviation of the frequency from a resonant frequency of the at least one cooling element such that the drive signal is adjusted based on the deviation.

11. The system of claim 9, wherein the vibrational motion includes a driving phase and a relaxation phase, the system further comprising:
    at least one energy regenerator coupled with the plurality of cooling elements and with the switching and control module, the at least one energy regenerator configured to receive power from the plurality of cooling elements due to the relaxation phase of the vibrational motion.

12. The system of claim 9, wherein the plurality of cooling cells is separated into at least one tile, a drive signal of the at least one drive signal being provided to all cooling cells in a tile of the at least one tile.

13. A method, comprising:

receiving at least one drive signal input; and providing at least one drive signal to a plurality of cooling elements based on at least one drive signal input, the at least one drive signal having a frequency corresponding to at least one cooling element of the plurality of cooling elements, a plurality of cooling cells including the plurality of cooling elements configured to be actuated to induce vibrational motion to drive a fluid toward a heat-generating structure, the frequency corresponding to a resonant state of the at least one cooling element.

14. The method of claim 13, wherein at least a portion of the plurality of cooling cells are separated into a tile and wherein the providing the at least one drive signal further includes:

providing a drive signal of the at least one drive signal to the tile.

15. The method of claim 14, wherein the vibrational motion includes a driving phase and a relaxation phase, the method further comprising:

receiving power from the plurality of cooling elements due to the relaxation phase of the vibrational motion; and storing the power.

16. The method of claim 13, wherein the plurality of cooling cells is in a tile and wherein the at least one drive signal further includes:

providing a drive signal of the at least one drive signal to all cooling cells of the tile.

17. The method of claim 13, wherein the frequency of the at least one drive signal is within at least ten percent of a resonant frequency corresponding to the resonant state.

18. The method of claim 13, wherein the frequency of the at least one drive signal corresponds to a tile resonant state.

19. The method of claim 13, further comprising:

measuring the drive signal, the measured drive signal indicating a deviation of the frequency from a resonant frequency of the at least one cooling element such that the at least one drive signal is adjusted based on the deviation.

\* \* \* \* \*